(12) United States Patent
Okushima

(10) Patent No.: US 6,512,663 B1
(45) Date of Patent: Jan. 28, 2003

(54) ELECTROSTATIC PROTECTION DEVICE AND ELECTROSTATIC PROTECTION CIRCUIT

(75) Inventor: Mototsugu Okushima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/576,777

(22) Filed: May 23, 2000

(30) Foreign Application Priority Data

May 24, 1999 (JP) ............................................ 11-143747

(51) Int. Cl.$^7$ .............................. H02H 3/22; H02H 9/00
(52) U.S. Cl. ........................................ 361/111; 361/54
(58) Field of Search .................... 361/111, 54; 257/360, 257/141, 133

(56) References Cited

U.S. PATENT DOCUMENTS

| | | | | | |
|---|---|---|---|---|---|
| 5,079,608 A | * | 1/1992 | Wodarczyk et al. | ..... | 357/23.13 |
| 5,173,755 A | * | 12/1992 | Co et al. | ..... | 257/361 |
| 5,182,220 A | * | 1/1993 | Ker et al. | ..... | 437/34 |
| 5,264,723 A | * | 11/1993 | Strauss | ..... | 257/532 |
| 5,291,051 A | * | 3/1994 | Hoang et al. | ..... | 257/360 |
| 5,528,188 A | * | 6/1996 | Au et al. | ..... | 327/310 |
| 5,574,621 A | * | 11/1996 | Sakamoto et al. | ..... | 361/321.1 |
| 5,581,101 A | * | 12/1996 | Ning et al. | ..... | 257/347 |
| 5,625,522 A | * | 4/1997 | Watt | ..... | 361/111 |

FOREIGN PATENT DOCUMENTS

| | | | | |
|---|---|---|---|---|
| JP | 56-40279 | 4/1981 | ............ | H01L/29/78 |
| JP | 57-99776 | 6/1982 | ............ | H01L/29/78 |
| JP | 10-189876 | 7/1988 | ............ | H01L/27/04 |
| JP | 7-244991 | 9/1995 | ............ | G11C/16/06 |
| JP | 9-223748 | 8/1997 | ........ | H01L/21/8238 |
| JP | 11-87631 | 3/1999 | ............ | H01L/27/06 |

OTHER PUBLICATIONS

N. Weste et al. Principles of CMOS VLSI Design, 1985, Addison–Wesley Co., pp. 96–98.*

* cited by examiner

Primary Examiner—Stephen W. Jackson
Assistant Examiner—Z Kitov
(74) Attorney, Agent, or Firm—Hayes Soloway PC

(57) ABSTRACT

In an electrostatic protection device, a parasitic bipolar transistor has a base region. A trigger device is arranged adjacent to the parasitic bipolar transistor and injects charges generated by static electricity into the base region.

5 Claims, 10 Drawing Sheets

ELECTROSTATIC PROTECTION DEVICE AND ELECTROSTATIC PROTECTION CIRCUIT

BACKGROUND OF THE INVENTION

This invention relates to an electrostatic protection device and an electrostatic protection circuit used to prevent breakdown caused by static electricity.

In general, a semiconductor device is readily broken by static electricity. To this end, various protection devices (or elements) and a protection circuit including these protection devices are provided between an input/output pad connected to an external circuit and an internal circuit.

In particular, a gate insulating film of a MOS device is readily broken by the static electricity. Consequently, when excessive charges having a voltage higher than an operation voltage are generated by electrostatic discharge from the input/output pad in a MOS circuit, the excessive charges must be rapidly discharged to a ground before the operation voltage reaches a breakdown voltage of the gate insulating film in an internal CMOS circuit.

Under this circumstance, the static electricity can be easily discharged by forward characteristics of an n+p diode when a negative electrostatic discharge is applied to the input/output pad of the CMOS circuit.

However, when a positive electrostatic discharge is applied thereto, it is difficult to protect the gate insulating film by the use of the n+p diode.

Therefore, a parasitic bipolar transistor or a parasitic thyrister is generally and conventionally used as an effective electrostatic protection device.

Referring to FIGS. 1A and 1B, description will be made about a first related electrostatic protection circuit.

The first related electrostatic protection circuit uses a parasitic bipolar transistor, and a gate electrode G is grounded, as illustrated in FIG. 1A.

The first protection circuit can be widely used because a manufacturing process of n-MOSFETs of the internal CMOS circuit may be used.

In this event, the first electrostatic protection circuit illustrated in FIG. 1A is equivalent to a circuit in which a substrate resistor Rsub of a p-type semiconductor substrate 12 is connected to a base electrode B of an npn-type parasitic bipolar transistor 11.

A circuit diagram of the equivalent circuit is shown in FIG. 1A while current-voltage characteristics of the equivalent circuit are shown in FIG. 1B.

Herein, description will be made about a principle of electrostatic protection with respect to the first electrostatic protection circuit using the parasitic bipolar transistor.

When an excessive negative voltage generated by an electrostatic discharge is given to the input/output pad, the static electricity is discharged to the ground by the forward characteristics of an n+p junction between an n+ layer of an electrode S side and the p-type semiconductor substrate 12.

More specifically, a forward current If flows so as to discharge static electricity to the ground by exceeding an offset voltage Vos, as illustrated in FIGS. 1A and 1B.

In the meantime, when an excessive positive voltage generated by the electrostatic discharge is given to the input/output pad, the static electricity is discharged to the ground by snap-back characteristics for a reverse voltage.

In particular, as an applied voltage is increased, a reverse current Ir of the n+p junction is gradually increased, as shown in FIG. 1B. The reverse current Ir flows into the substrate resistor Rsub, and a potential of the base electrode B is increased by a voltage drop (15).

When the potential reaches a first trigger potential (Vt1, It1), the potential of the base electrode B is increased. Thereby, the npn-type parasitic bipolar transistor 11 is turned on. Herein, the n+p junction of the npn-type parasitic bipolar transistor 11 is almost broken down near the first trigger potential (Vt1, It1) in FIG. 1B.

Thereafter, a large current flows from the electrode S to an electrode D to discharge the static electricity to the ground (16).

When the applied voltage increases more, the current is also increased (17). Thereby, the npn-type parasitic bipolar transistor 11 is again broken down near a point of (Vt2, It2).

Consequently, the voltage is reduced while the current is increased (18). Finally, the devices are irreversibly changed by high-temperature heat are thereby broken (19).

Subsequently, description will be made about a second related electrostatic protection circuit.

The second related electrostatic protection circuit uses a parasitic thyrister 2 which is laterally directed, as illustrated in FIG. 2A.

An equivalent circuit of the second related electrostatic protection circuit is illustrated in FIG. 1C.

Such a circuit includes a lateral npn-type parasitic bipolar transistor 21, a vertical pnp-type parasitic bipolar transistor, a resistor Rnw of an n-well region, and a substrate resistor Rsub of a p-type semiconductor substrate 22, as illustrated in FIGS. 2A and 2C. Herein, the current-voltage characteristics of the equivalent circuit are shown in FIG. 2B.

The electrostatic protection principle of the second related electrostatic protection circuit using a parasitic thyrister is almost the same as the above-mentioned electrostatic protection principle of the first related electrostatic protection circuit using the parasitic bipolar transistor.

Specifically, when the excessive negative voltage generated by the electrostatic discharge is applied to the input/output pad, the static electricity is discharged to the ground by the forward characteristics of an n+p junction between an n+ layer of an electrode C side and the p-type semiconductor substrate 22.

Consequently, the forward current If flows so as to discharge the static electricity to the ground by exceeding the offset voltage Vos, as shown in FIG. 2B.

On the other hand, when the excessive positive voltage generated by the electrostatic discharge is given to the input/output pad, the static electricity is discharged to the ground by the snap-back characteristics for the reverse voltage.

That is, as the applied voltage is increased, the reverse current of the n+p junction is gradually increased, as illustrated in FIG. 2B. The reverse current flows into the substrate resistor Rsub, and the potential of the base electrode B is increased by a voltage drop (15').

When the potential reaches a first trigger potential (Vt1, It1), the lateral npn-type parasitic bipolar transistor 21 is turned on by the increase of the potential of the base electrode B.

In consequence, the lateral thyrister 2 is turned on by a positive feedback operation of a pair of lateral and vertical transistors. Herein, it is to be noted that the n+p junction of the lateral npn-type parasitic bipolar transistor 21 is almost broken down near the first trigger potential (Vt1, It1) in FIG. 2B.

Thereby, a large current flows from an electrode A to an electrode K to discharge the static electricity to the ground (16').

When the applied voltage is further increased, the current is also increased (17'), and the lateral npn-type parasitic bipolar transistor 21 is again broken down near a point of (Vt2, It2). Consequently, a voltage is reduced while a current is increased (18') in FIG. 2B.

Finally, the device is irreversibly changed by high-temperature heat and is thereby broken (19').

Meanwhile, the semiconductor device has been further reduced in size with micropatterning due to recent progress in technology. In the meantime, the semiconductor device becomes ever more sensitive with micropatterning. As a result, semiconductor devices are often broken by a low voltage.

In [the] recent years, the thickness of the gate insulating film of MOS devices has been thinned to about 4 nm, while the breakdown voltage of the gate insulating film has been reduced to about 7 V in CMOS devices which are super-micropatterned.

In the future, the micropatterning of semiconductor devices and the reduction in size of the devices will undoubtedly continue to advance.

Therefore, when the related electrostatic protection circuit is used in a compact semiconductor device which is reduced in size, the semiconductor device may be broken by the static electricity before the electrostatic protection circuit is operated (triggered).

In order to avoid such a problem, an electrostatic protection circuit having an operation voltage (trigger voltage) depending on a low breakdown voltage of the compact semiconductor device must be developed and produced.

However, even when the development and production of such devices have succeeded, the semiconductor device will continue to be further reduced in size. In consequence, a similar procedure or process will be repeated many times in the future.

SUMMARY OF THE INVENTION

It is therefore an object of this invention to provide an electrostatic protection device or circuit which is capable of effectively solving the various problems described above.

That is, it is a first object to efficiently decrease a trigger voltage of an electrostatic protection device or circuit.

More specifically, the first object is to provide an electrostatic protection device or circuit which operates at a low voltage, which is not higher than the breakdown voltage of the internal circuit, on the condition that the voltage falls within such a range that is not lower than the operation voltage of the internal circuit.

It is a second object to provide an economical electrostatic protection device or circuit which is capable of directly using a conventional manufacturing method of an electrostatic protection device or circuit without any changes.

It is a third object to provide an electrostatic protection device or circuit which is not self-broken by an increase of an applied voltage.

An electrostatic protection device according to this invention includes a parasitic bipolar transistor and a trigger device.

In this case, the trigger device is provided adjacent to the parasitic bipolar transistor and injects charges generated by static electricity into a base region of the parasitic bipolar transistor.

Thus, the trigger device injects the charges generated by the static electricity into the base region of the parasitic bipolar transistor. Consequently, the operation voltage (namely, trigger voltage) of the parasitic bipolar transistor advantageously is effectively reduced.

Further, the trigger device has an insulating film. In this condition, the charges generated by the static electricity are passed through the insulating film by a tunnel effect, and are injected into the base region of the parasitic bipolar transistor.

Thereby, the charges are shielded by the insulating film of the trigger device at a low voltage. On the other hand, the charges are passed by the tunnel effect at a high voltage to flow into the base electrode of the parasitic bipolar transistor.

In consequence, a waste current does not flow to the ground in a normal state in which an electrostatic discharge does not occur. In the meantime, the excessive charges generated by the static electricity advantageously flow to the ground only in a dangerous state in which electrostatic discharge takes place.

Further, a gate electrode is formed on a semiconductor substrate via a gate insulating film. Moreover, a device isolation layer is formed on the semiconductor substrate of the peripheral portion of the gate electrode.

With such a structure, an increase of a voltage Vox applied to the gate insulating film is suppressed before the gate insulating film is broken. Consequently, the gate insulating film can be advantageously prevented from being broken.

Herein, description will be made about this principle with reference to FIGS. 4A and 4B.

A trench as a device isolation layer is formed. Thereby, the number of minority carriers collected to an inversion layer 41 on a surface of the semiconductor substrate becomes low (namely, the minority carriers are short). In consequence, a depletion layer 42 must be extended to compensate for the shortage of the minority carriers.

In order to extend the depletion layer, even if the voltage applied to the gate electrode is increased from a certain value to be higher than the certain value, the increase of the voltage is used for an increase of a voltage applied to the semiconductor substrate from a voltage Vs1 to Vs2, and is not used for an increase of a voltage Vox applied to the gate insulating film.

In this event, the voltage Vox applied to the gate insulating film is saturated, and a tunnel current depending on the voltage Vox and passing through the gate insulating film is also saturated.

In order to enhance the tendency of the shortage of minority carriers collected to the inversion layer 41, the trench may be filled in with insulators, such as SiO9.

In place of the trench, a semiconductor region having a polarity opposite to the polarity of the semiconductor substrate may be formed.

In the capacitor device, a low-resistance layer is preferably formed in the semiconductor substrate.

Thereby, the voltage applied to the gate insulating film before the gate insulating film is broken is suppressed from increasing.

As a result, the gate insulating film can be advantageously prevented from being broken.

Further, a tunnel current passing through the gate insulating film can be induced along the low-resistance layer.

Consequently, concentration of the tunnel current can be effectively adjusted at a single point. Further, diffusion of the tunnel current into a predetermined region can be advantageously adjusted.

Moreover, the capacitor device preferably has a diode connected in parallel to the gate electrode.

After the diode is broken down, the reverse current of the diode and the tunnel current are effectively added to each other to flow into the semiconductor substrate.

In the electrostatic protection device, the parasitic bipolar transistor is triggered by injecting trigger currents of one or more trigger devices. In consequence, a decrease in operation voltage (namely, a trigger voltage) of the parasitic bipolar transistor depending on the characteristics of the specific trigger elements can be advantageously achieved.

Further, the parasitic bipolar transistor and the trigger device are arranged such that an adjacent area of the parasitic bipolar transistor and the trigger device is increased.

When the parasitic bipolar transistor and the trigger device are close to each other, the trigger current can be accurately and readily injected into the base electrode of the parasitic bipolar transistor. In consequence, a waste current is advantageously prevented from flowing.

The semiconductor device according to this invention is strong against static electricity because its internal circuit is protected by the electrostatic protection circuit.

DESCRIPTION OF THE PREFERRED EMBODIMENTS

An electrostatic protection device and an electrostatic protection circuit according to this invention will be described below with reference to the accompanying drawings.

First Embodiment

Figure 3A:
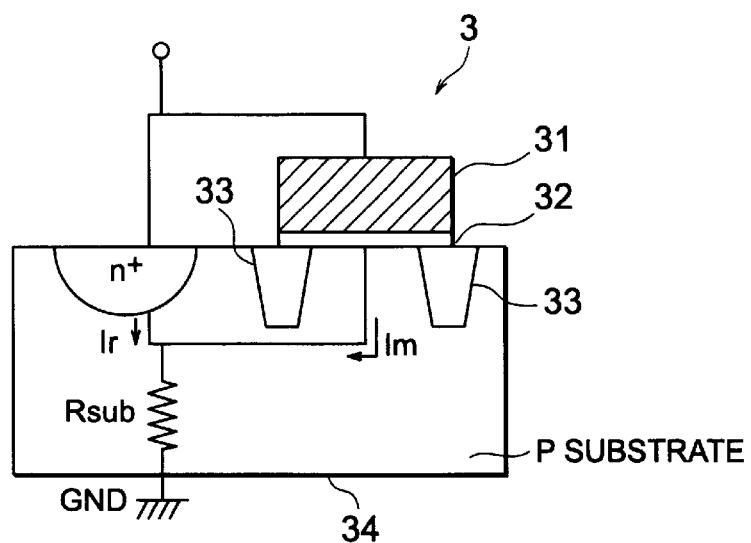
FIG. 3A is a sectional view showing an electrostatic protection device (including a capacitor device) according to a first embodiment of this invention.
Figure 3B:
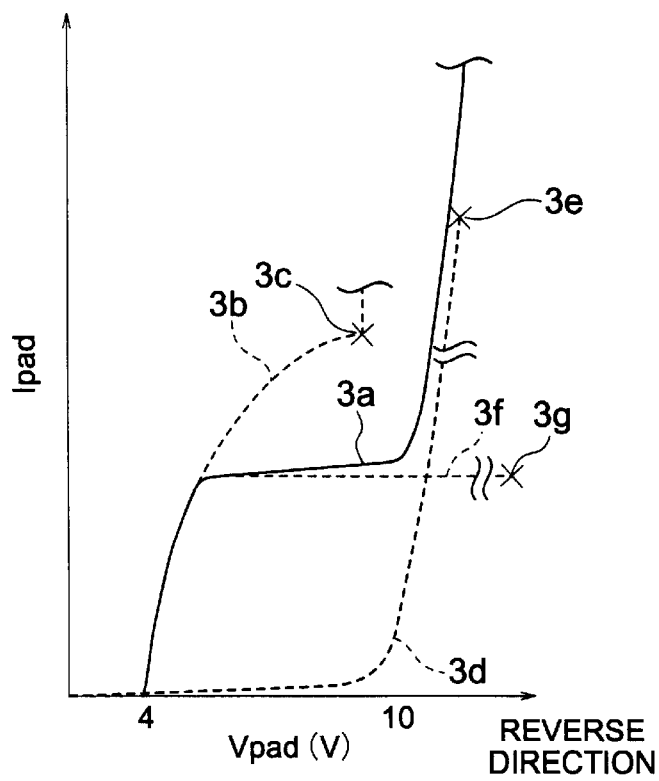
FIG. 3B is a graph showing the current-voltage characteristic of the capacitor device according to a first embodiment of this invention.
Figure 4A:
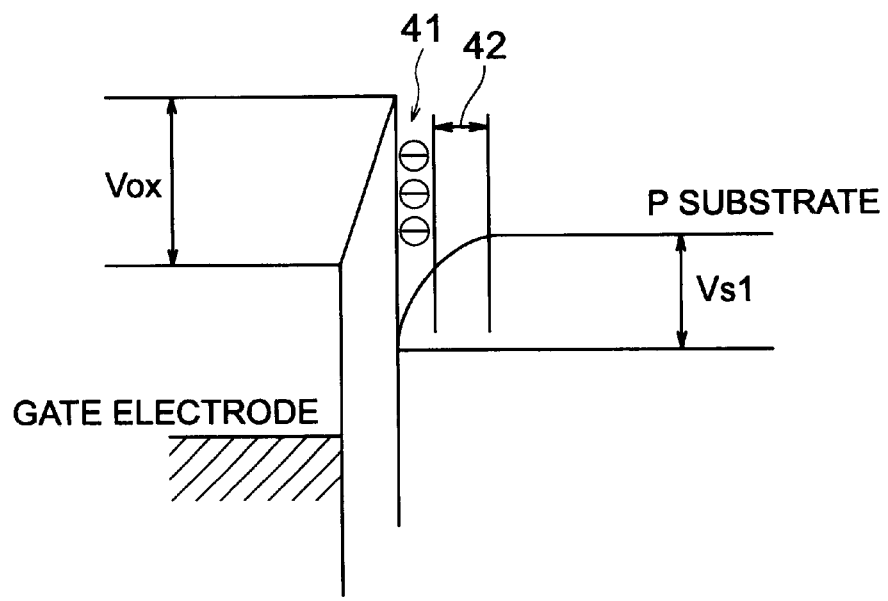
FIGS. 4A and 4B are band diagrams showing the characteristics of a capacitor device.
Figure 4B:
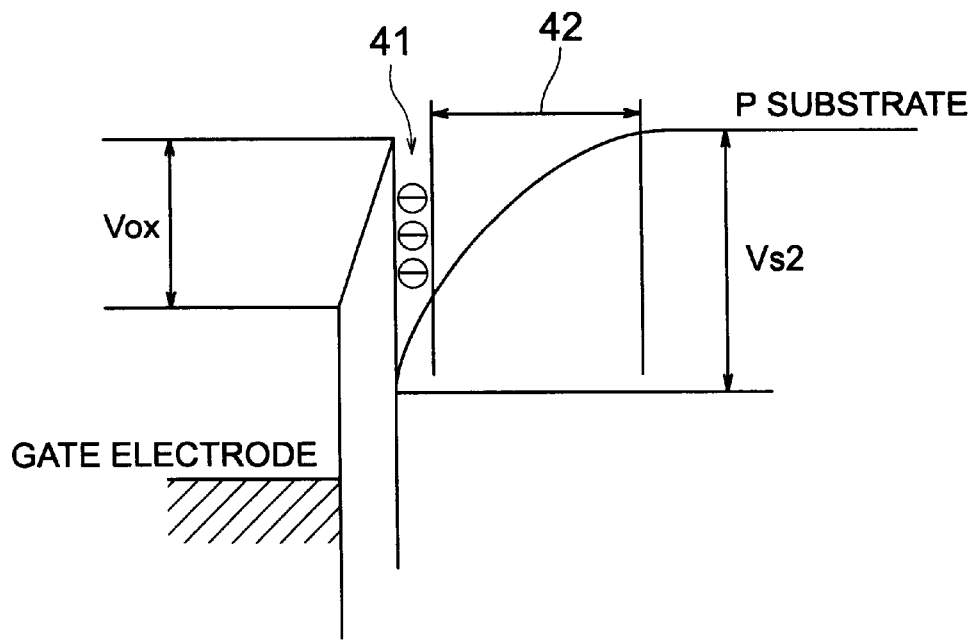

Referring to FIGS. 3A and 3B, description will be made about a first embodiment of this invention.

An electrostatic protection device or circuit according to the first embodiment includes a MOS device 3 (namely, a capacitor device), as illustrated in FIG. 3A. In such a MOS device 3, a silicon oxide insulating film 32 is formed on a p-type semiconductor substrate 34, and a gate electrode 31 is formed on the silicon oxide insulating film 32.

Further, trenches 33 are formed in the p-type semiconductor substrate 34 to surround the peripheral portion of the gate electrode 31, and each of the trenches is filled in with a silicon oxide insulator.

In addition, an n+ layer is buried adjacent to the gate electrode 31 to form a parasitic n+p diode, and the n+ electrode is connected to the gate electrode 31 through a conductive line.

In this event, current-voltage characteristics for a reverse voltage of the capacitor device according to the first embodiment are expressed by a solid line 3a shown in FIG. 3B.

Until an applied voltage becomes about 4 V, a current rarely flows due to the effects of the insulating film and the diode, as illustrated in FIG. 3B. A current value is increased from about 4 V by a tunnel current Im.

Thereafter, although the tunnel current Im is saturated by the effect of the trench 33, the diode is broken down at a point where the applied voltage becomes about 10 V, and the current value is increased again by a reverse current Ir.

More specifically, a current obtained by adding the tunnel current Im and the reverse current Ir flows into the substrate resistor Rsub of the p-type semiconductor substrate 34.

Herein, it is assumed that the potential of a diffusion layer arranged adjacent to the gate electrode is fixed regardless of the capacitor device. In this case, charges can be always supplied from the diffusion layer to the inversion layer.

Consequently, the potential is increased as indicated by a broken line 3b shown in the graph of FIG. 3B, and the insulating film is broken in the MOS element before the diode is broken down (3c).

The capacitor device 3 of the first embodiment effectively prevents this phenomenon by arranging a device isolation layer (namely, the trench 33).

However, even when only the device isolation layer is arranged, the graph shifts parallel to the abscissa as indicated by a broken line 3f, and only the voltage applied to the p-type semiconductor substrate 34 is continuously increased while the current is saturated. In consequence, the insulating film is irreversibly changed by high-temperature heat and is broken (3g).

In the capacitor device 3 according to the first embodiment, the diode is connected to the MOS device in parallel. As a result, an increase in voltage is limited depending on the characteristics of the diode indicated by a broken line 3d at a voltage higher than the breakdown voltage of the diode. Further, the reverse current Ir flows into the substrate resistor Rsub of the p-type semiconductor substrate 34.

More specifically, the MOS device and the diode are coupled to each other in parallel in the first embodiment. Consequently, the graph 3a indicated by a solid line in FIG. 3B showing the current-voltage characteristics is obtained by adding the broken line 3f and the broken line 3d to each other.

Thereby, an insulating film breakdown 3c of the MOS device 3, a breakdown 3g of the semiconductor substrate 34 of the MOS device 3, and a breakdown 3e of the diode can each be prevented.

Second Embodiment

Figure 5A:
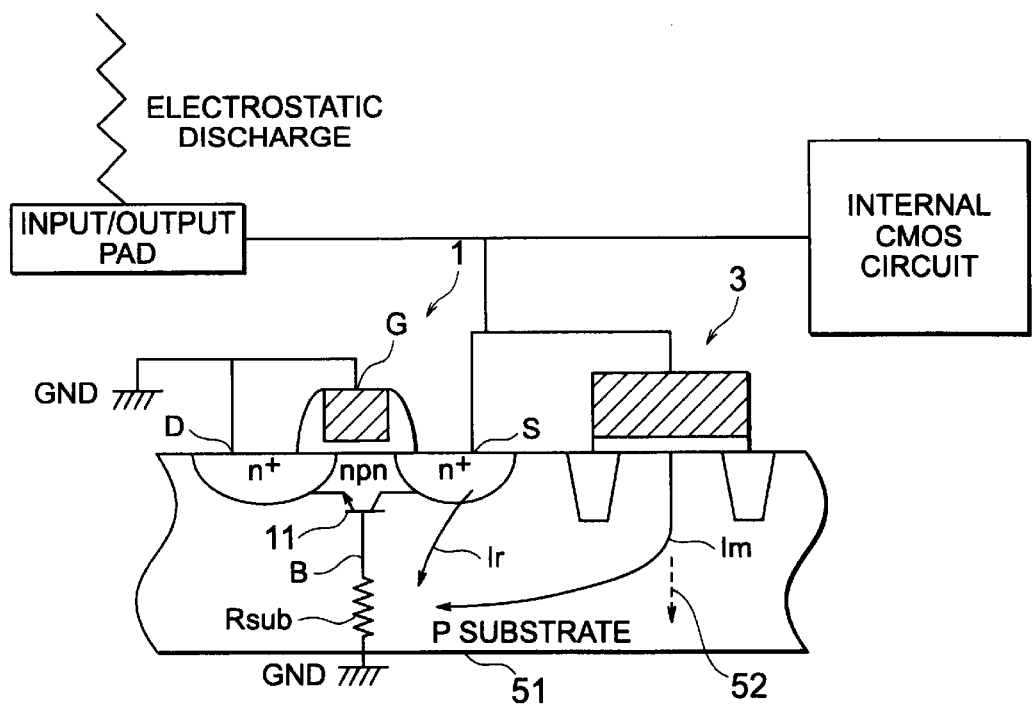
FIG. 5A is a sectional view showing an electrostatic protection device or circuit according to a second embodiment of this invention.
Figure 5B:
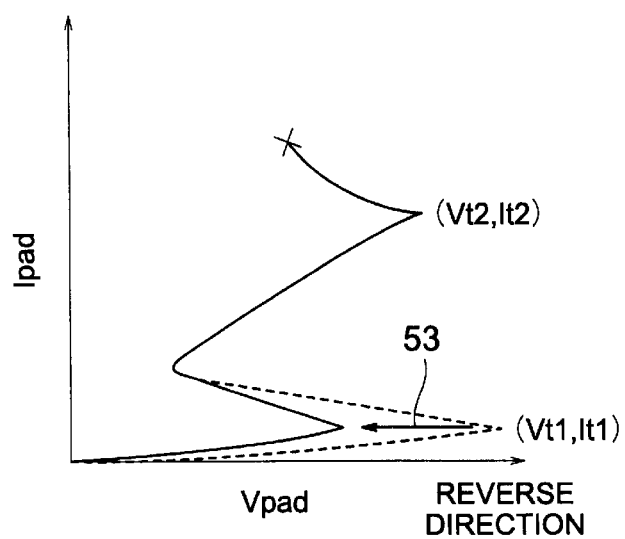
FIG. 5B is a graph showing the current-voltage characteristics of the electrostatic protection device or circuit according to a second embodiment of this invention.
Figure 6A:
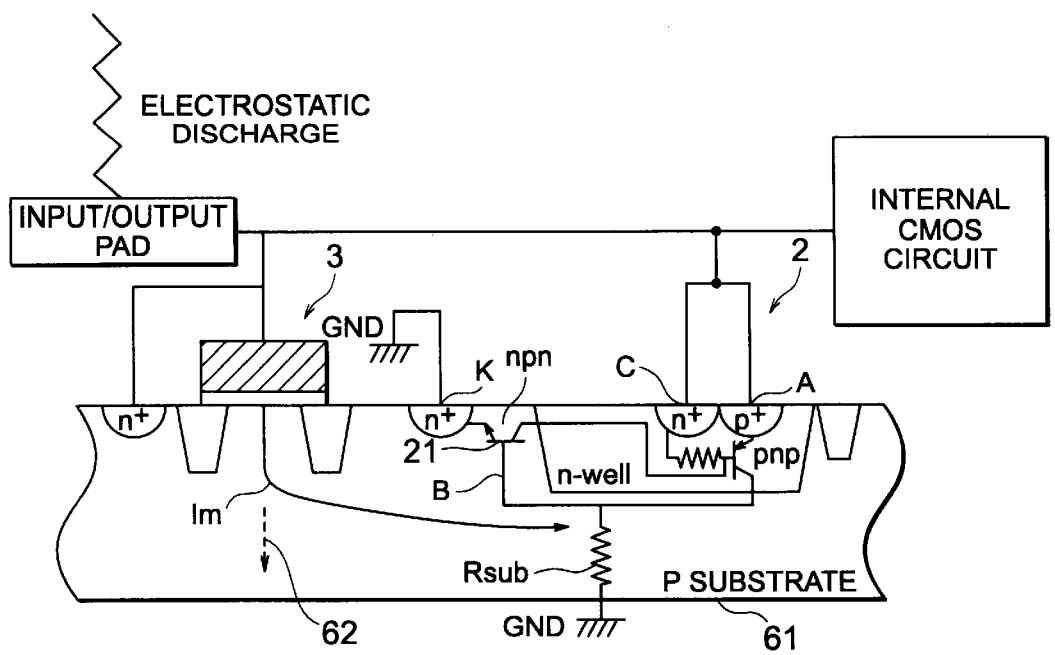
FIG. 6A is a sectional view showing an electrostatic protection device or circuit according to a third embodiment of this invention.

Referring to FIGS. 6A and 5B, description will be made about a second embodiment of this invention.

In the electrostatic protection device or circuit according to the second embodiment, a capacitor device 3 is formed at an adjacent position of a n-MOSFET 1 serving as an electrostatic protection device on a p-type semiconductor substrate 51 of the n-MOSFET 1.

Herein, it is to be noted that the capacitor device 3 has the same structure as the capacitor device 3 illustrated in FIG. 3A according to the first embodiment.

With this structure, the electrostatic protection device is connected between an input/output pad and an internal CMOS circuit, and is coupled to the ground.

Figure 7A:
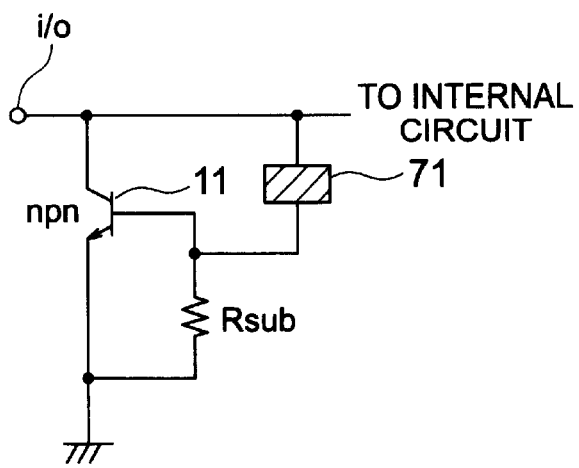
FIG. 7A is a circuit diagram showing an equivalent circuit of an electrostatic protection device or circuit according to a second embodiment of this invention.

In this event, the n+ electrode of the parasitic n+p diode of the capacitor device 3 is shared by an electrode S formed on the n+ layer of the n-MOSFET 1. Herein, this circuit diagram is shown in FIG. 7A.

Figure 1A:
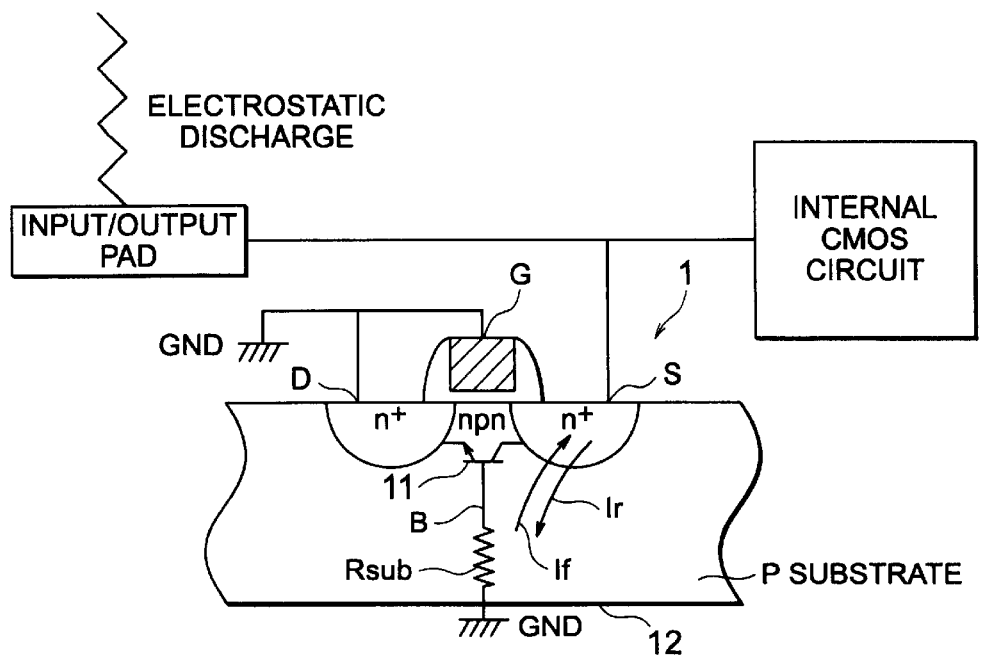
FIG. 1A is a sectional view of a first related electrostatic protection device or circuit.
Figure 1B:
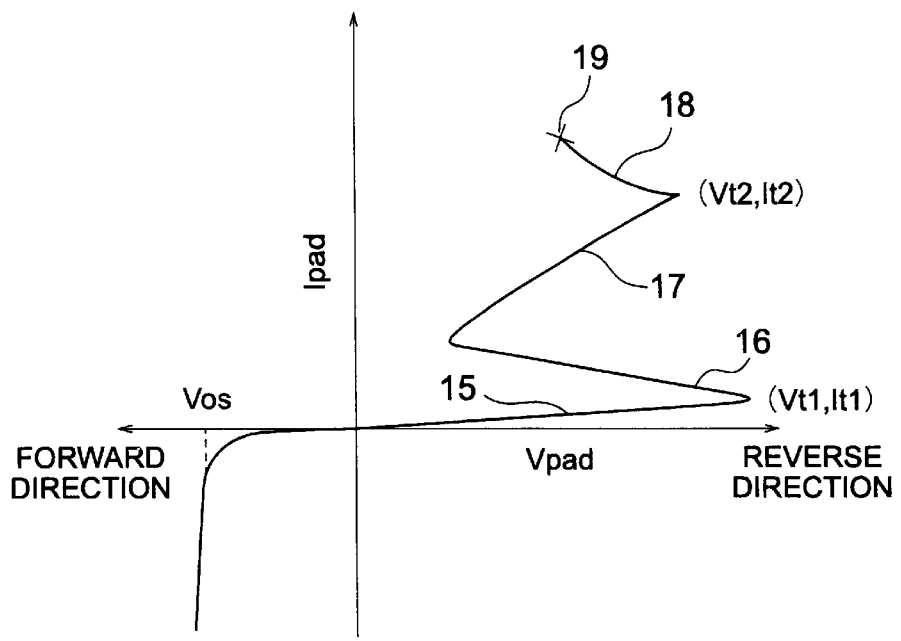
FIG. 1B is a graph showing the current-voltage characteristics of a first related electrostatic protection device or circuit.
Figure 1C:
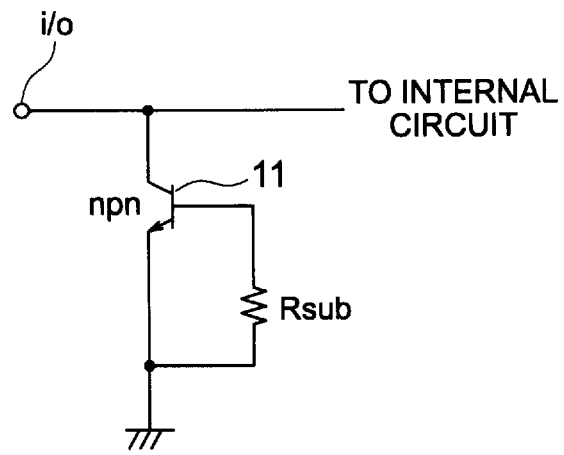
FIG. 1C is a circuit diagram showing an equivalent circuit of a first related electrostatic protection circuit.

In the first related electrostatic protection device having only the nMOSFET 1 (as illustrated in FIG. 1A), an npn-type parasitic bipolar transistor 11 is triggered by only the reverse current Ir.

By contrast, the electrostatic protection device according to the second embodiment utilizes the tunnel current Im as a trigger current. Consequently, a decrease 53 of trigger voltage Vt1 can be achieved, as illustrated in FIG. 5B.

Herein, an example which uses the electrostatic protection device according to the second embodiment as effective electrostatic protection means will be described below with numerical values.

Conventionally, the normal operation voltage of the internal CMOS circuit is equal to 3.3 V, and the thickness and the breakdown voltage of the gate insulating film are equal to 8 nm and 10 V, respectively.

Further, a base potential required to turn on the parasitic bipolar transistor 11, namely, the potential difference between the substrate resistances Rsub, is equal to 0.8 V.

In the n-MOSFET 1 serving as the electrostatic protection device, the base potential of the npn-type parasitic bipolar transistor 11 can be set to be 0.8 V at a trigger voltage Vt1=9 V.

In this case, it is assumed that the film thickness of the recent gate insulating film is changed to 4 nm. The gate insulating film breakdown voltage is decreased to 7 V when the film thickness of the gate insulating film becomes 4 nm, and the recent gate insulating film is broken before the electrostatic protection device is triggered in the conventional n-MOSFET 1.

In contrast, an electrostatic protection device according to the second embodiment was produced. In this case, the n-MOSFET 1 utilized the same manufacturing line as that for an n-MOSFET used in the internal CMOS circuit, and the capacitor device 3 could also be manufactured by the use of the conventional manufacturing step.

Therefore, all the film thicknesses of the gate insulating films of the internal CMOS circuit, the nMOSFET 1, and the capacitor device 3 were equal to 4 nm.

When the electrostatic protection device according to the second embodiment was applied to a semiconductor device, the applied voltage exceeded a normal operation voltage of 3.3 V of the internal CMOS circuit by the electrostatic discharge.

When the applied voltage became 4 V, the capacitor device 3 began to cause the tunnel current to flow into the base electrode B of the parasitic bipolar transistor. In consequence, when the applied voltage became 6 V, the potential difference between the substrate resistors Rsub became 0.8 V, and the parasitic bipolar transistor 11 was turned on.

Excessive charges generated by static electricity were rapidly discharged to the ground, and the gate insulating film breakdown of the internal CMOS circuit could be prevented.

Third Embodiment

Figure 6B:
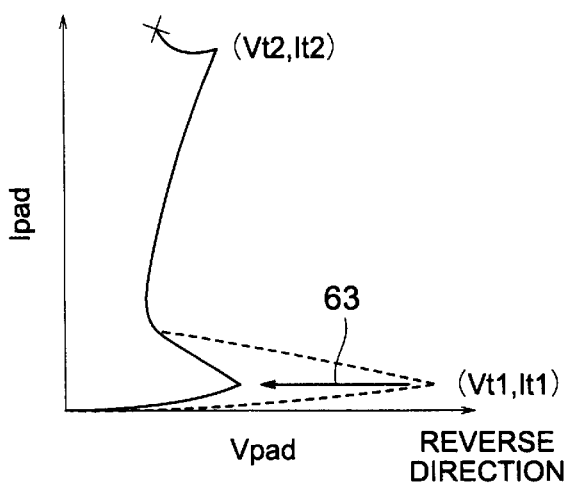
FIG. 6B is a graph showing the current-voltage characteristics of the electrostatic protection device or circuit according to a third embodiment of this invention.

Referring to FIGS. 6A and 6B, description will be made about a third embodiment of this invention.

Figure 7B:
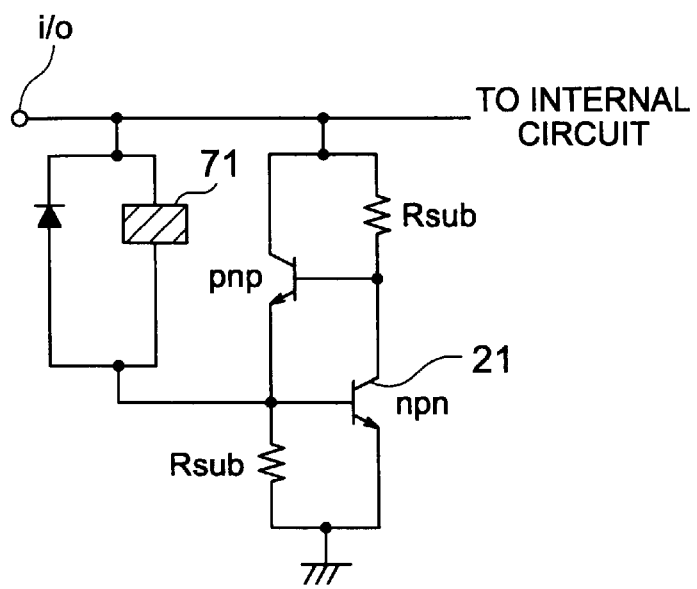
FIG. 7B is a circuit diagram showing an equivalent circuit of an electrostatic protection device or circuit according to a third embodiment of this invention.

In a electrostatic protection device or circuit according to the third embodiment, the capacitor device 3 of the first embodiment is arranged adjacent to a lateral thyrister 2 formed in a p-type substrate 61. Herein, it is to be noted that the circuit diagram of the electrostatic protection device is shown in FIG. 7B.

Figure 2C:
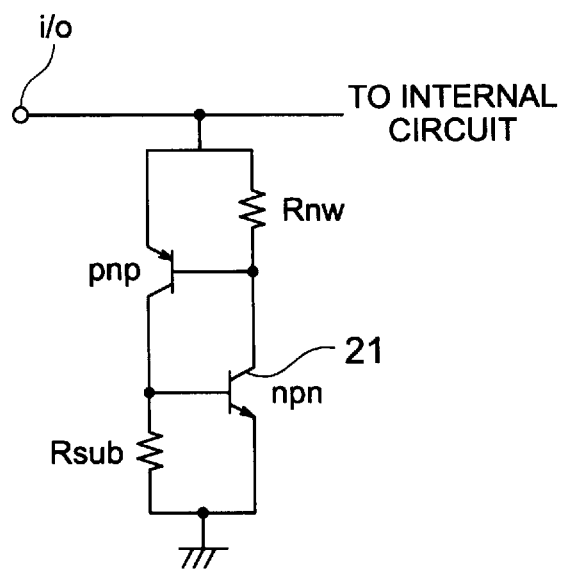
FIG. 2C is a circuit diagram showing an equivalent circuit of a second related electrostatic protection circuit.
Figure 2A:
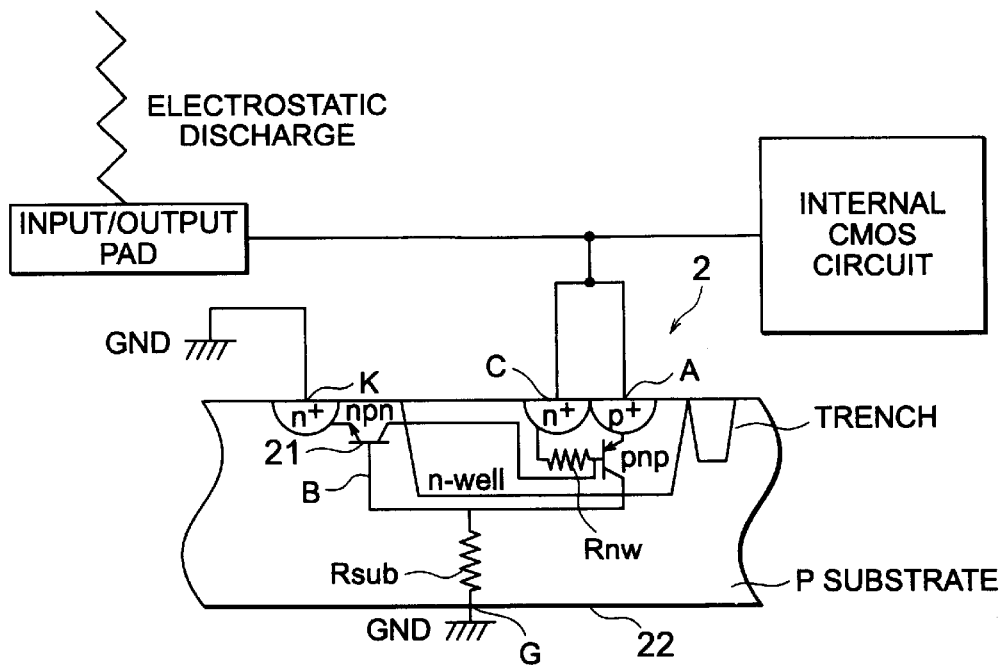
FIG. 2A is a sectional view of a second related electrostatic protection device or circuit.
Figure 2B:
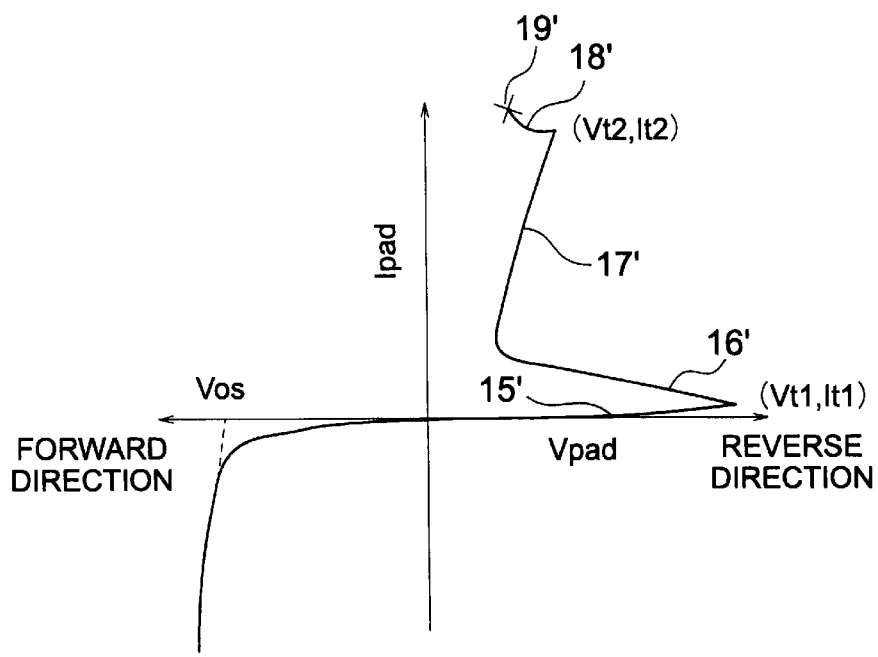
FIG. 2B is a graph showing the current-voltage characteristics of a second related electrostatic protection device or circuit.

In a second related electrostatic protection device (as illustrated in FIG. 2A) including only the lateral thyrister 2, a parasitic bipolar transistor 21 is triggered by only a reverse current Ir.

On the other hand, the electrostatic protection device according to the third embodiment uses a tunnel current Im as a trigger current. In consequence, a decrease 63 of a trigger voltage Vt1 can be achieved, as shown in FIG. 6B.

Fourth Embodiment

Figure 8:
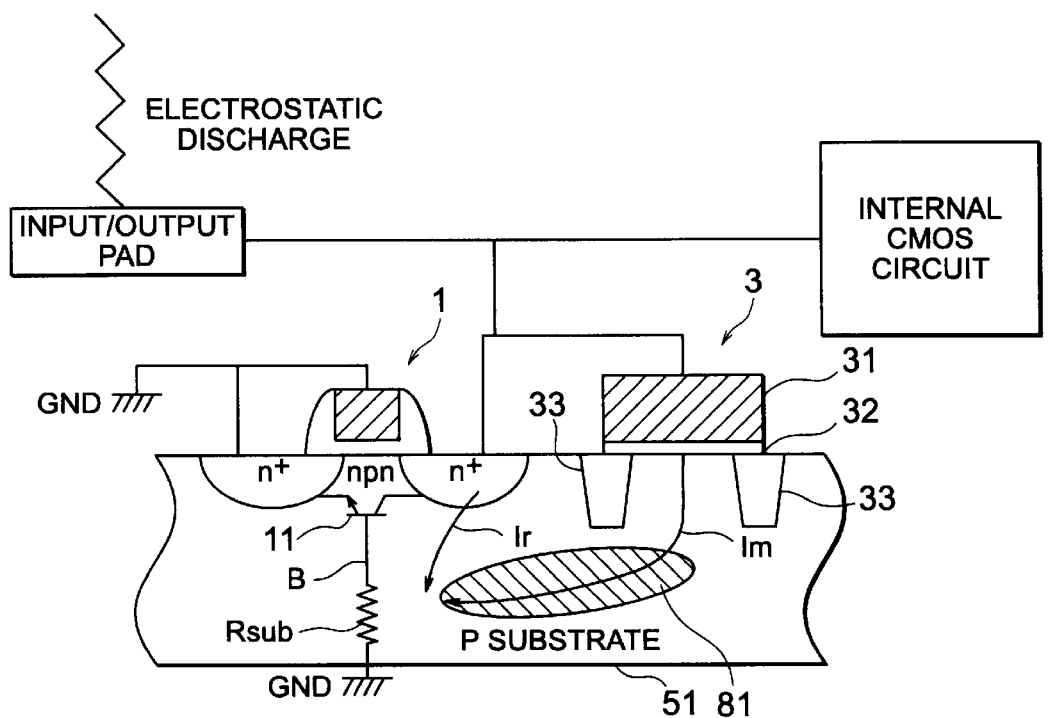
FIG. 8 is a diagram showing an electrostatic protection device or circuit according to a fourth embodiment of this invention.

Referring to FIG. 8, description will be made about a fourth embodiment of this invention.

As shown in FIG. 8, a tunnel current Im flowing into the ground without passing through a substrate resistor Rsub is decreased in the electrostatic protection device according to the second embodiment.

To this end, a high-concentration low-resistance layer 81 is formed in a p-type semiconductor substrate 51. The low-resistance layer 81 is formed in a such a range that a tunnel current Im is introduced to a base electrode B of a parasitic bipolar transistor 11.

Specifically, the low-resistance layer 81 is formed in an area away from a region surrounded by a trench 33 which is under a silicon oxide insulating film 32 and which generates a depletion layer in application to a position immediately before the base electrode B of the npn-type parasitic bipolar transistor 11.

In this case, it is preferable that the low-resistance layer 81 is not formed in the region in which the depletion layer is generated in application.

In addition, it is desirable that the low-resistance layer 81 is not formed in the region of the substrate resistor Rsub. This reason will be explained as follows.

Namely, the low-resistance layer 81 formed in the region decreases the resistance of the substrate resistor Rsub. Further, it is difficult to increase the voltage of the base electrode B. As a result, a trigger voltage Vt1 of the electrostatic protection device is increased.

The low-resistance layer 81 can also be applied to the electrostatic protection device according to the third embodiment, and the tunnel current 62 flowing into the ground without passing through the substrate resistor Rsub is reduced.

Fifth Embodiment

Figure 9:
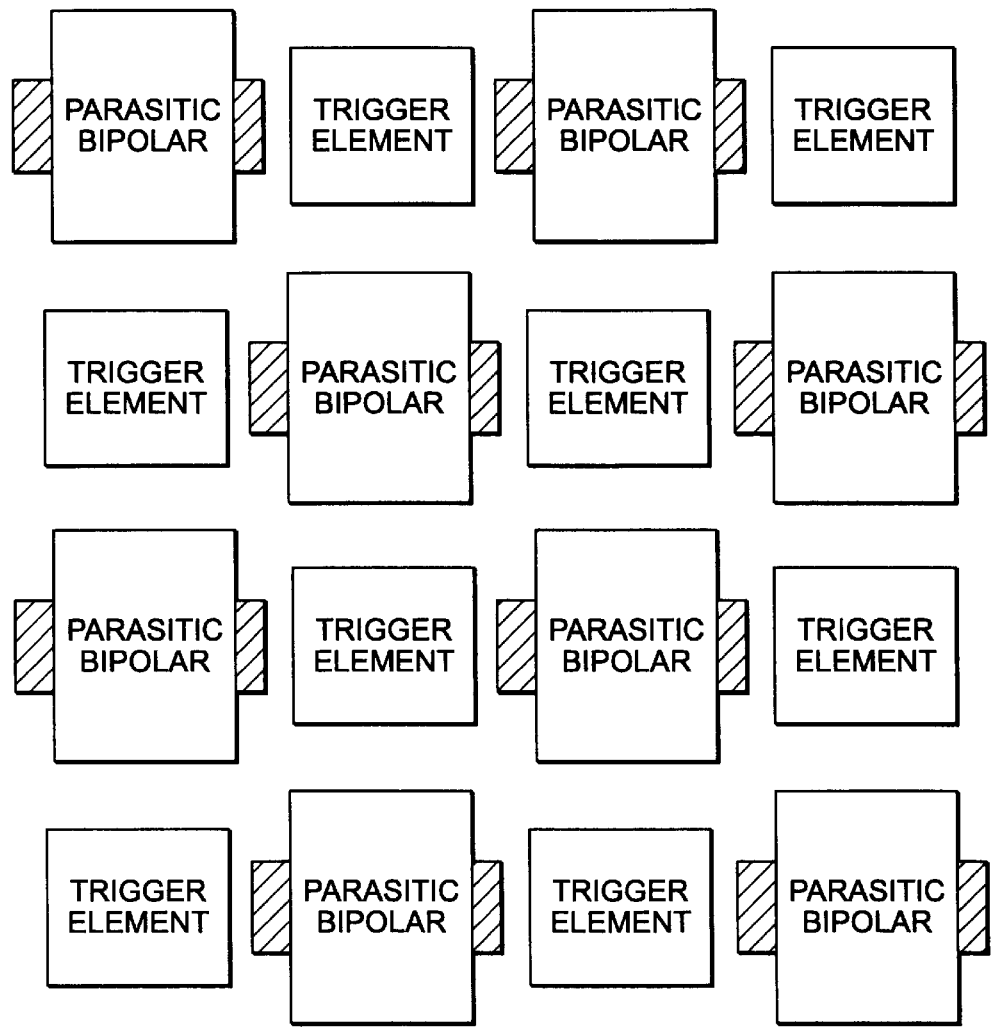
FIG. 9 is a diagram showing a device arrangement of an electrostatic protection circuit according to a fifth embodiment of this invention.

Referring to FIG. 9, description will be made about a fifth embodiment of this invention.

As shown in FIG. 9, in an electrostatic protection circuit according to the fifth embodiment, parasitic bipolar transistors and trigger elements are arranged such that the adjacent areas of the parasitic bipolar transistors and trigger devices are increased.

In the electrostatic protection circuit, parasitic bipolar transistors and trigger devices (elements) are alternately arranged in a grating form.

In the electrostatic protection circuit according to the fifth embodiment, the parasitic bipolar transistors are arranged in four directions of one trigger element. Consequently, the incidence of waste tunnels, i.e., tunnel currents that do not flow into the base electrode B of the parasitic bipolar transistor, is effectively reduced.

Further, the trigger devices are arranged in the four directions of one parasitic bipolar transistor. Thereby, a trigger current flowing into the base electrode B of the parasitic bipolar transistor and flowing in the substrate resistor Rsub is increased. As a result, a trigger voltage Vt1 of the electrostatic protection circuit is efficiently decreased.

In this vein, when the low-resistance layer 81 is formed, resistor layers may be branched toward the base electrodes B of the four parasitic bipolar transistors adjacent to one trigger device.

According to this invention, first, the trigger voltage of the electrostatic protection device (element) can be efficiently decreased.

Second, an economical electrostatic protection device can be provided, in which a conventional electrostatic protection device manufacturing method, can be directly used without any change.

Third, an electrostatic protection device is not self-broken by an increase in applied voltage.

Fourth, a tunnel current can reliably flow as a trigger current into the base electrode or the substrate resistor of a parasitic bipolar transistor to more efficiently decrease the trigger current.

Fifth, various electrostatic protection devices are provided, and the arrangement of the electrostatic protection devices is devised. For this reason, an infinite number of combinations of electrostatic protection devices or circuits can be effected, and the degree of decrease in trigger voltage can be steplessly selected.

What is claimed is:

1. An electrostatic protection device, comprising:
   a parasitic bipolar transistor which has a base region;
   a trigger device which is arranged adjacent to the parasitic bipolar transistor and which injects charges generated by static electricity into the base region, said trigger device comprising a capacitor device comprising a gate electrode disposed on a semiconductor substrate via a gate insulating film, said capacitor device further comprising a device isolation layer disposed at a peripheral portion of said gate electrode in said semiconductor substrate; and
   a diode having an n+ electrode connected to said gate electrode, said diode connected to said capacitor device in parallel.

2. An electrostatic protection device as claimed in claim 1, wherein:
   the trigger device has an insulating film, and
   the charges generated are passed through the insulating film by a tunnel effect to be injected into the base region.

3. An electrostatic protection device as claimed in claim 1 wherein:
   a low-resistance layer is formed in the semiconductor substrate.

4. An electrostatic protection device as claimed in claim 1 wherein:
   the device isolation layer constitutes a trench, and the trench is filled with $SiO_2$.

5. An electrostatic protection circuit, comprising:
   a plurality of parasitic bipolar transistors, each having a base region; and
   a plurality of trigger devices, each being arranged adjacent to at least one of said parasitic bipolar transistors and injecting charges generated by static electricity into the base region of said adjacent parasitic bipolar transistor (a) at least one said parasitic bipolar transistor has four trigger devices disposed directly adjacent thereto, one said trigger device on each of four sides thereof, such that one said trigger device is disposed adjacent thereto to the left and to the right of said parasitic bipolar transistor within the same row, as well as above and below said parasitic bipolar transistor within the same column; and (b) at least one said trigger device has four said parasitic bipolar transistors disposed directly adjacent thereto, one said parasitic bipolar transistor on each of four sides thereof, such that one said parasitic bipolar transistor is disposed adjacent thereto to the left and to the right of said trigger device within the same row, as well as above and below said trigger device within the same column.

* * * * *